(12) United States Patent
Hsieh (10) Patent No.: US 11,600,725 B2
(45) Date of Patent: Mar. 7, 2023

(54) TRENCH MOSFETS INTEGRATED WITH CLAMPED DIODES HAVING TRENCH FIELD PLATE TERMINATION TO AVOID BREAKDOWN VOLTAGE DEGRADATION

(71) Applicant: NAMI MOS CO., LTD., New Taipei (TW)

(72) Inventor: Fu-Yuan Hsieh, New Taipei (TW)

(73) Assignee: NAMI MOS CO., LTD., New Taipei (TW)

( * ) Notice: Subject to any disclaimer, the term of this patent is extended or adjusted under 35 U.S.C. 154(b) by 0 days.

(21) Appl. No.: 17/716,123

(22) Filed: Apr. 8, 2022

(65) Prior Publication Data

US 2022/0231167 A1 Jul. 21, 2022

Related U.S. Application Data

(62) Division of application No. 16/801,253, filed on Feb. 26, 2020, now Pat. No. 11,329,155.

(51) Int. Cl.
| | |
|---|---|
| *H01L 29/78* | (2006.01) |
| *H01L 27/02* | (2006.01) |
| *H01L 29/40* | (2006.01) |
| *H01L 29/49* | (2006.01) |
| *H01L 29/866* | (2006.01) |

(52) U.S. Cl.
CPC ...... *H01L 29/7823* (2013.01); *H01L 27/0255* (2013.01); *H01L 29/404* (2013.01); *H01L 29/407* (2013.01); *H01L 29/4916* (2013.01); *H01L 29/7821* (2013.01); *H01L 29/7825* (2013.01); *H01L 29/866* (2013.01)

(58) Field of Classification Search
CPC ............. H01L 29/7823; H01L 27/0255; H01L 29/404; H01L 29/407; H01L 29/4916; H01L 29/7821; H01L 29/7825; H01L 29/866; H01L 29/16; H01L 29/41766; H01L 29/4238; H01L 29/7811; H01L 29/7813; H01L 29/7808; H01L 27/0203; H01L 29/0615; H01L 29/0684
See application file for complete search history.

(56) References Cited

U.S. PATENT DOCUMENTS

| | | | | |
|---|---|---|---|---|
| 2010/0289059 A1* | 11/2010 | Hsieh | ................. | H01L 27/0629 257/334 |
| 2011/0121386 A1* | 5/2011 | Hsieh | ................. | H01L 29/0619 257/334 |
| 2011/0180844 A1* | 7/2011 | Hsieh | ............... | H01L 29/42372 257/E29.198 |
| 2013/0020576 A1* | 1/2013 | Hsieh | ................. | H01L 29/7811 257/66 |

* cited by examiner

*Primary Examiner* — Mohammed R Alam
(74) *Attorney, Agent, or Firm* — Bacon & Thomas, PLLC (57) ABSTRACT

A semiconductor power device having shielded gate structure in an active area and trench field plate termination surrounding the active area is disclosed. A Zener diode connected between drain metal and source metal or gate metal for functioning as a SD or GD clamp diode. Trench field plate termination surrounding active area wherein only cell array located will not cause BV degradation when SD or GD poly clamped diode integrated.

4 Claims, 16 Drawing Sheets

TRENCH MOSFETS INTEGRATED WITH CLAMPED DIODES HAVING TRENCH FIELD PLATE TERMINATION TO AVOID BREAKDOWN VOLTAGE DEGRADATION

FIELD OF THE INVENTION

This invention relates generally to the cell structure and device configuration of semiconductor devices. More particularly, this invention relates to an improved device configuration of power semiconductor devices integrated with clamp diodes having trench field plate termination to avoid breakdown voltage (BV) degradation.

BACKGROUND OF THE INVENTION

Shielded gate technology shrinks device die size about 30%~70% or above for voltages ranging from 30V to 200V, however, avalanche capability is degraded about the same ratio. In order to solve the issue, Drain-Source (SD) or Gate-Drain (GD) clamp diode is hence installed into the device for protection of Drain and source.

Figure 1A:
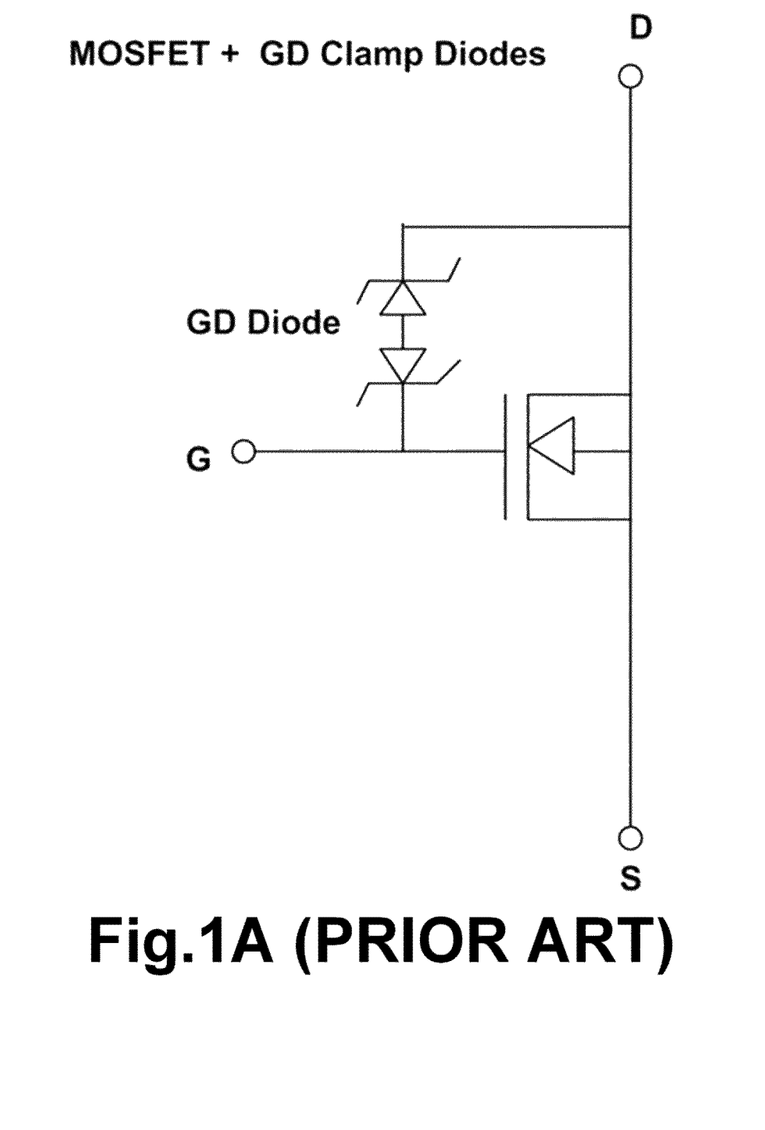
FIG. 1A is a circuit diagram illustrates the implementation of a MOSFET cell with gate-drain clamp diodes of a prior art.
Figure 1B:
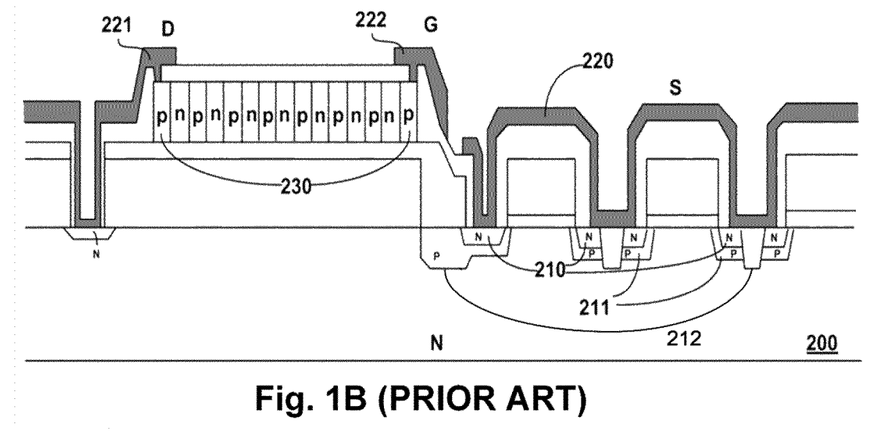
FIG. 1B is a side cross-sectional view of the prior art shown in FIG. 1.

FIG. 1A is a circuit diagram of a MOSFET with gate-drain clamp diodes and FIG. 1B is the cross section view of a MOSFET of prior art (U.S. Pat. No. 5,631,187) where the cell is formed on N substrate 200. On the top surface of the substrate 200, there is an N+ source region 210 surrounded by a P body region 211. A metal layer 220 makes electrical contact to both the N+ source region 210 and P body region 211 acting as a source electrode. Meanwhile, metal layer 222 and 221 are deposited to function as a gate electrode and a drain electrode of the cell structure, respectively. Between the gate electrode and drain electrode, a serial of back-to-back polysilicon diodes 230 are formed across over the termination to enhance the avalanche capability of the semiconductor power device. A guarding region (GR) 212 located in termination region near the polysilicon diodes 230 serves as part of a metal field plate for sustaining breakdown voltage of the termination.

The prior art discussed above (U.S. Pat. No. 5,631,187) is encountering a technical difficulty which is that, as the gate-drain (or gate-collector for IGBT) clamp diode must crosses over termination because the termination surrounds both gate metal pad and active area, a problem of breakdown voltage degradation will be arisen due to electric field in termination region is blocked by polysilicon. The prior art (IEEE Electron Device Letters Vol. 20, No. 8, August 1999; Page 424~427) shows breakdown voltage degradation when Field Limiting Rings (FLR) under Poly Clamped diode.

Accordingly, it would be desirable to provide a new and improved device configuration to prevent the degradation of breakdown voltage from happening.

SUMMARY OF THE INVENTION

It is therefore an object of the present invention to provide a new and improved device configuration to solve the problem discussed above.

Figure 2:
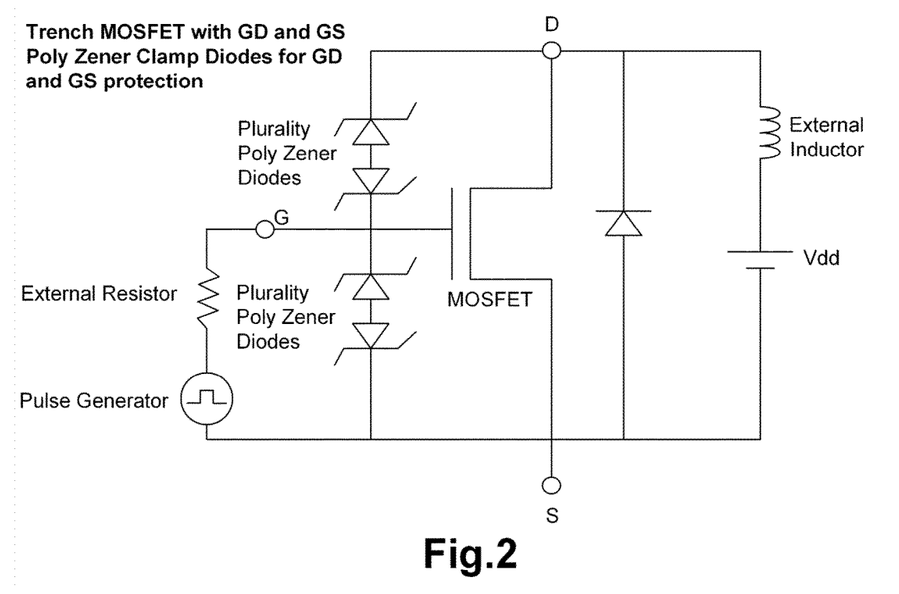
FIG. 2 is a circuit diagram that illustrates the implementation of a trench MOSFET cell with GD and GS Poly Zener Clamp Diodes for GD and GS protection of this invention.

One advantage of the present invention is that, trench field plate termination of the invented device only surrounds active area having a plurality of cell arrays. Gate metal pads used to integrate MOSFET with gate-drain clamp diodes and gate-source clamp diodes, as shown in FIG. 2 of circuit Diagrams and FIG. 3 of its top view is outside of the trench field plate termination. The gate-drain (or gate-collector for IGBT) clamp diode does not cross over termination. Therefore, in the present invention, the gate-drain (or gate-collector for IGBT) clamp diode will not cause BV degradation when GD or SD poly clamped diode integrated. This is because no Guard Ring or FLR under the poly clamped diode.

Figure 3:
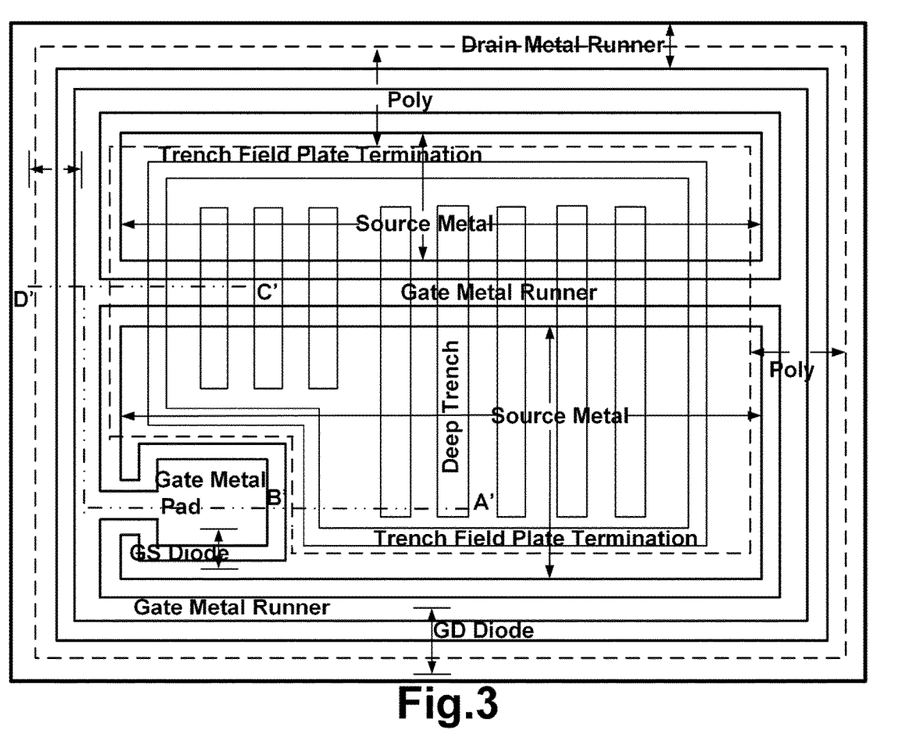
FIG. 3 is top view of the invention disclosed in FIG. 2 with at least one trench field plate surrounding active area, wherein GS diode surrounds between gate metal pad and source metal, and GD diode surrounds between gate metal runner and drain metal runner along device periphery.
Figure 4A:
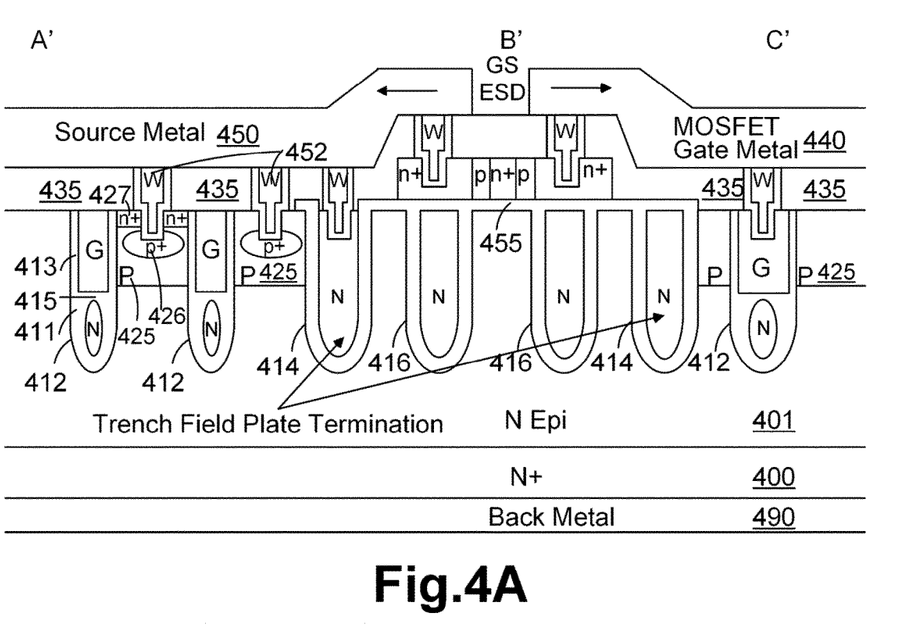
FIG. 4A is a side cross-sectional view of a trench MOSFET along A'-B'-C' axis marked in FIG. 3 of a preferred embodiment according to the present invention.
Figure 4B:
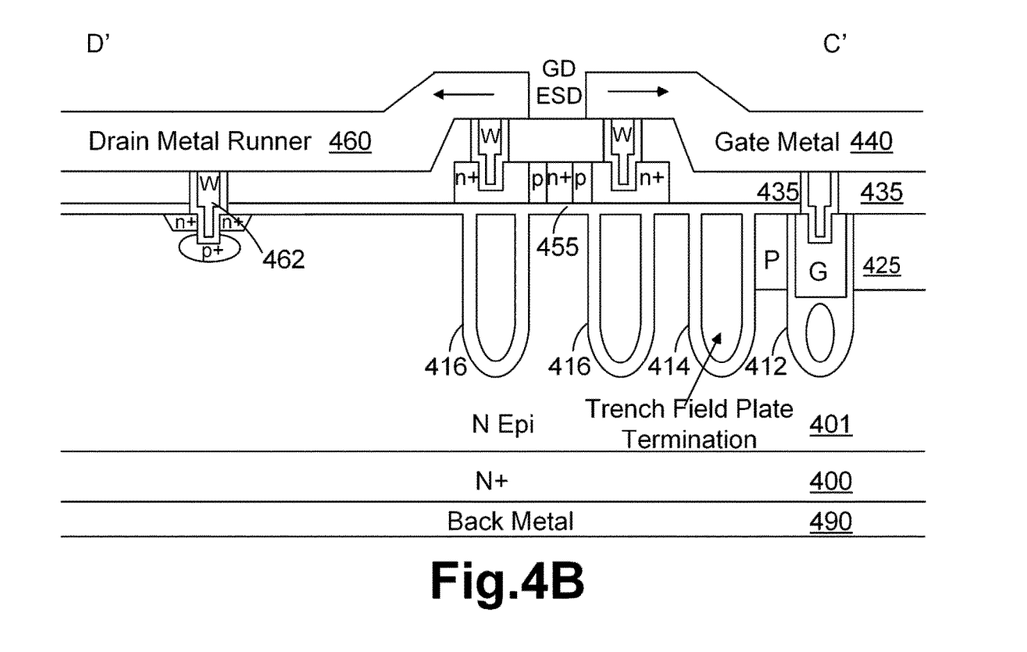
FIG. 4B is a side cross-sectional view of a trench MOSFET along C'-D' axis marked in FIG. 3 of a preferred embodiment according to the present invention.

Briefly in a preferred embodiment according to the present invention, as shown in FIG. 4A and FIG. 4B, which is the A'-B'-C' and C'-D' cross section view of FIG. 3, respectively. The present invention discloses a trench MOSFET device formed on a substrate heavily doped with a first semiconductor doping type, e.g., N+ doping type. onto the substrate, grown an N epitaxial layer and a plurality of trenches of different types were etched wherein. Each of the first type trenches 412 were filled with a shielded gate structure comprising a first poly-silicon in a lower portion to serve as a shielded electrode and a second poly-silicon layer in an upper portion to serve as a gate electrode, wherein the shielded electrode is insulated from the epitaxial layer by a first insulating film 411 and the gate electrode is insulated from the epitaxial layer by a gate insulating film 413 which has a thickness less than the first insulating film 411, wherein the shielded electrode and the gate electrode are insulated from each other by a second insulating film 415; a trench field plate termination area comprises at least a second type trench 414 surrounding the active area, wherein each the second type trench 414 is filled with the shielded gate only and connected with the source metal; a Gate-Source (GS) clamp diode formed between the gate metal 440 and the source metal 450; and a Gate-Drain (GD) clamp diode formed between a gate metal 440 and a drain metal 460 along the device periphery; a third type trenches 416 filled with the shielded gate disposed directly and symmetrically underneath trenched contact areas of anode and cathode in the GS and GD clamp diodes, serving as a buffer layer for prevention of gate-drain shortage.

Figure 5A:
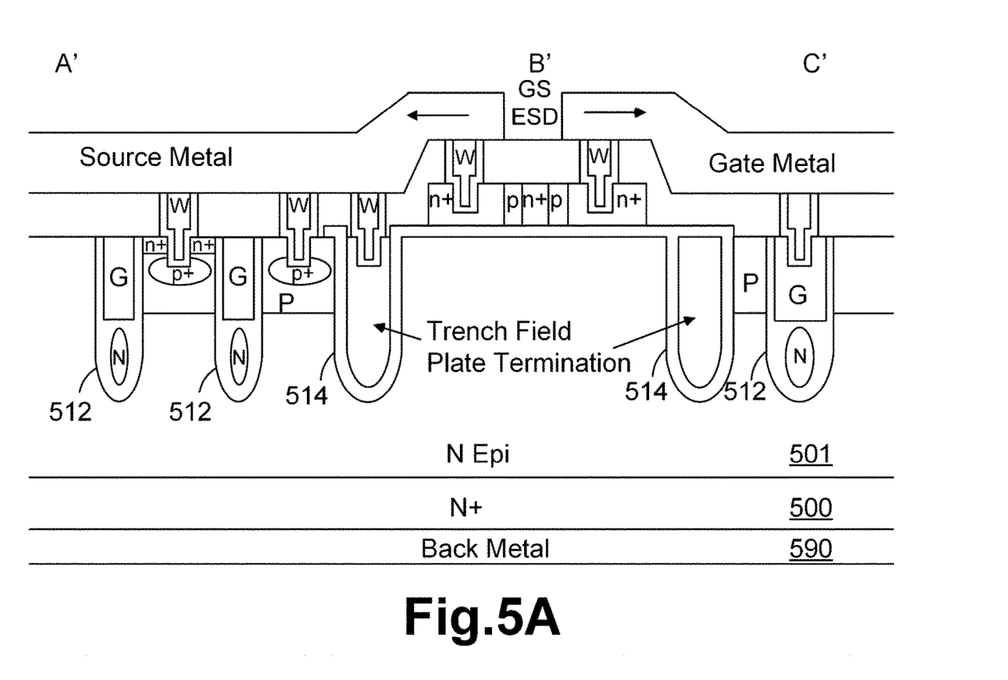
FIG. 5A is a side cross-sectional view of a trench MOSFET along A'-B'-C' axis marked in FIG. 3 of another preferred embodiment according to the present invention.
Figure 5B:
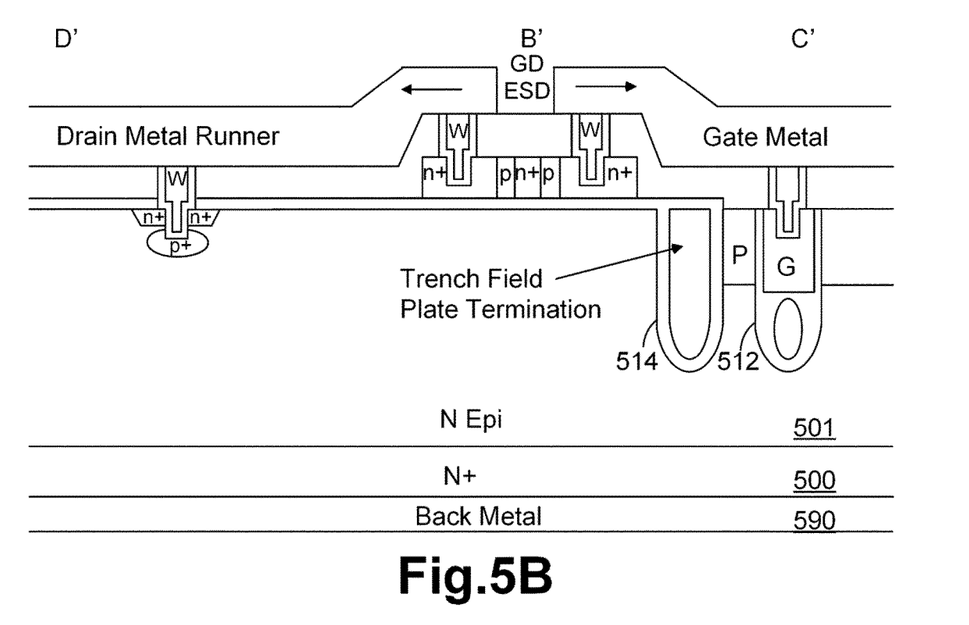
FIG. 5B is a side cross-sectional view of a trench MOSFET along C'-D' axis marked in FIG. 3 of another preferred embodiment according to the present invention.

Briefly in another preferred embodiment according to the present invention, as shown in FIG. 5A and FIG. 5B, which also shows the A'-B'-C' and C'-D' cross section view of FIG. 3, respectively. The trench MOSFET structure disclosed is similar to the structure disclosed in FIG. 4A and FIG. 4B except that no third type trenches filled with the shielded gate exist in the structure shown in FIG. 5A and FIG. 5B.

Preferred embodiments include one or more of the following features: the shielded electrode is doped with a second conductivity type which is opposite to the first conductivity type and the gate electrode is doped with the first conductivity type; The shielded electrode and the gate electrode are doped with the first conductivity type; The present invention further comprises a third type trenches filled with the shielded gate disposed directly and symmetrically underneath trenched contact areas of anode and cathode in the GD and GS clamp diodes, serving as a buffer layer for prevention of gate-body shortage; The GD and GS clamp diodes are constituted of at least one pair of back to back Zener diodes comprising multiple alternatively arranged doped regions of the first conductivity type and doped regions of the second conductivity type opposite to the first conductivity type.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Please refer to FIG. 2 for a preferred circuit diagram that illustrates the implementation of a trench MOSFET cell with GD and GS Poly Zener Clamp Diodes for GD and GS protection of this invention. Gate metal pads are used to integrate MOSFET with gate-drain clamp diodes and gate-source clamp diodes of circuit Diagrams and FIG. 3 of top view.

Please refer to FIG. 3 for a top view of the invention disclosed in FIG. 2 with at least one trench field plate surrounding active area, wherein GS diode surrounds between gate metal pad, and source metal and GD diode surrounds between gate metal runner and drain metal runner along device periphery.

Please refer to FIG. 4A and FIG. 4B for a preferred embodiment of this invention showing the A'-B'-C' and C'-D' cross section of FIG. 3, respectively, where a trench MOSFET device cell integrated with gate-source clamp diodes is formed on a heavily N+ doped substrate 400 coated with back metal 490 on rear side as drain electrode. Onto the substrate 400, a lighter N doped epitaxial layer 401 is grown, and a plurality of trenches with different types is etched. Each of the first type trenches 412 were filled with a shielded gate structure comprising a first poly-silicon in a lower portion to serve as a shielded electrode and a second poly-silicon layer in an upper portion to serve as a gate electrode, wherein the shielded electrode is insulated from the epitaxial layer by a first insulating film 411 and the gate electrode is insulated from the epitaxial layer by a gate insulating film 413 which has a thickness less than the first insulating film 411, wherein the shielded electrode and the gate electrode are insulated from each other by a second insulating film 415; a trench field plate termination area comprises at least a second type trench 414 surrounding the active area, wherein each the second type trench 414 is filled with the shielded gate and connected with the source metal; a Gate-Drain (GD) clamp diode formed between a gate metal 440 and a drain metal runner 460 along the device periphery; and a Gate-Source (GS) clamp diode formed between the gate metal 440 and the source metal 450; a third type trenches 416 filled with the shielded gate disposed directly and symmetrically underneath trenched contact areas of anode and cathode in the GD and GS clamp diodes, serving as a buffer layer for prevention of gate-body shortage; the GD and GS clamp diodes are constituted of at least one pair of back to back Zener diodes comprising multiple alternatively arranged doped regions of the first conductivity type and doped regions of the second conductivity type opposite to the first conductivity type. The top surface of the semiconductor substrate extending over the top of the trenched gate, the P body regions 425, the p+ regions 426 and the source regions 427 are covered with an NSG and a BPSG protective layers 435. A metal layer is formed on top of the insulation protective layer 435 and patterned into a source metal 450, a gate metal 440 and a drain metal runner 460. Trenches are opened through the protective layer 435 and filled with tungsten plug surrounded by Ti/TiN barrier layers (Ti/TiN/W) contact plug are formed as the source-body trenched contacts 452, the drain trenched contact 462 and gate trenched contact with the doped p+ contact regions 426 formed below the bottom of the contact to improve the electric contact to the source/body and the drain regions. In order to provide the GS polysilicon Zener clamp diodes and GS polysilicon Zener clamp diodes, polysilicon layer is formed on an oxide layer 455 disposed on the surface of the substrate and doped as alternating n+ and p regions adjacent to each other.

Please refer to FIG. 5A and FIG. 5B for another preferred embodiment of this invention showing the A'-B'-C' and C'-D' cross section of FIG. 3, respectively. The trench MOSFET structure disclosed is similar to the structure in FIG. 4A and FIG. 4B except that no third type trenches filled with the shielded gate exist in the structure shown in FIG. 5A and FIG. 5B.

Figure 6:
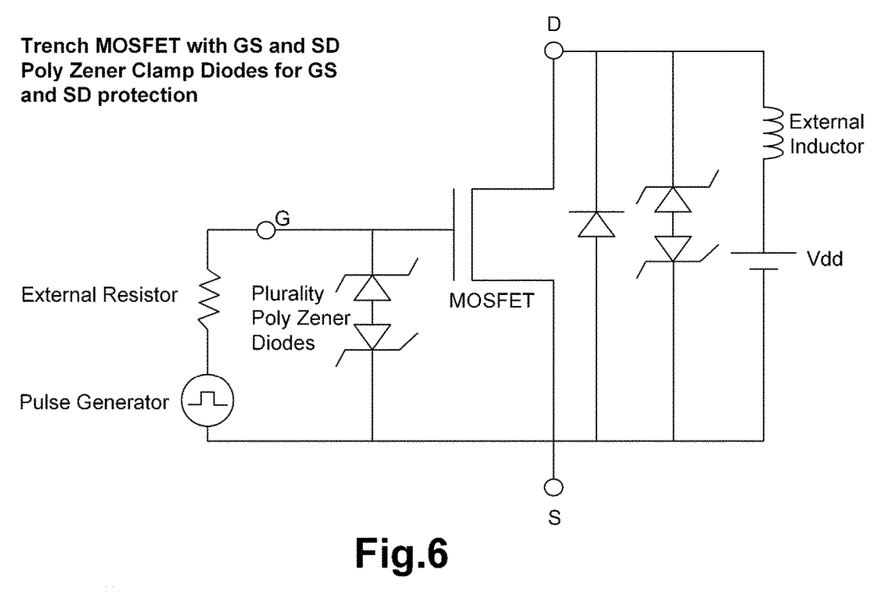
FIG. 6 is a circuit diagram that illustrates the implementation of a trench MOSFET cell with GS and SD Poly Zener Clamp Diodes for GS and SD protection of this invention.

Please refer to FIG. 6 for another preferred circuit diagram that illustrates the implementation of a trench MOSFET cell with GS and SD Poly Zener Clamp Diodes for GS and SD protection of this invention. The device integrates a GS clamp diode between gate and source electrodes and a SD clamp diode between source and drain electrodes.

Figure 7:
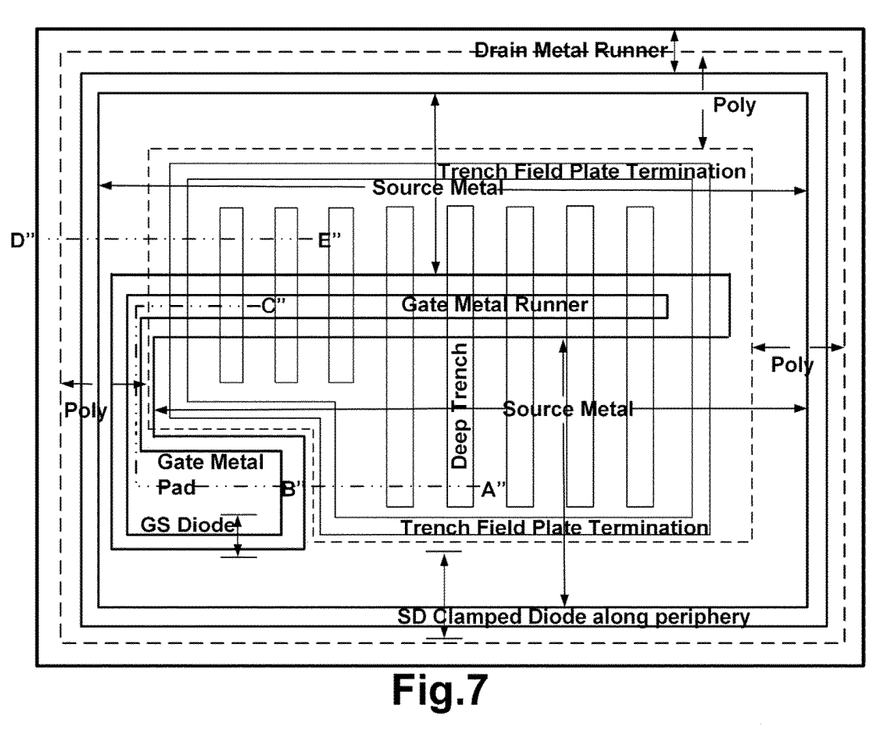
FIG. 7 is top view of the invention disclosed in FIG. 6, wherein GS diode surrounds between gate metal pad and source metal, and SD diode surrounds between source metal and drain metal runner along device periphery.

Please refer to FIG. 7 for a top view of the invention disclosed in FIG. 6, wherein GS diode surrounds between gate metal pad, source metal, and SD diode surrounds between source metal and drain metal runner along device periphery.

Figure 8A:
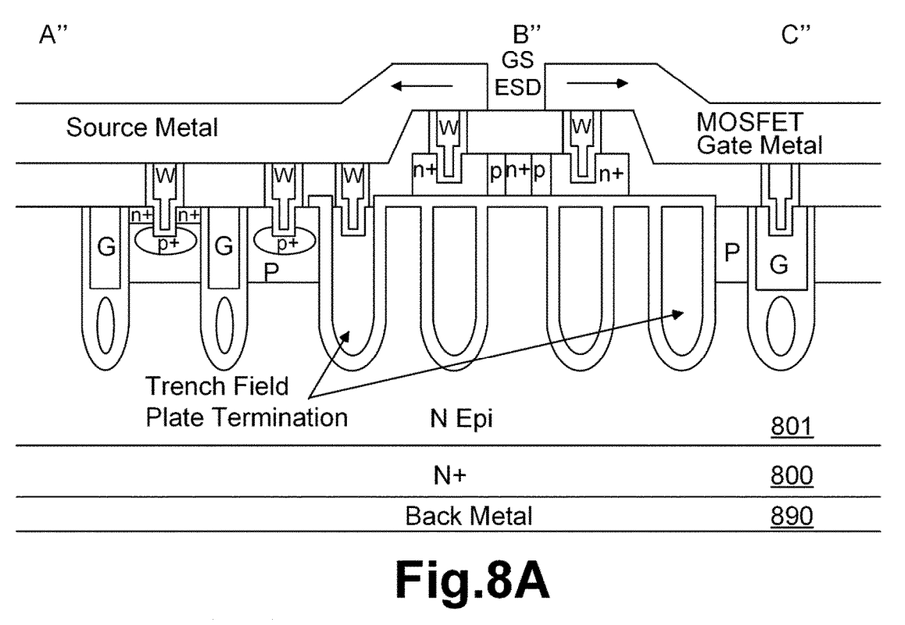
FIG. 8A is a side cross-sectional view of a trench MOSFET along A"-B"-C" axis marked in FIG. 7 of a preferred embodiment according to the present invention.
Figure 8B:
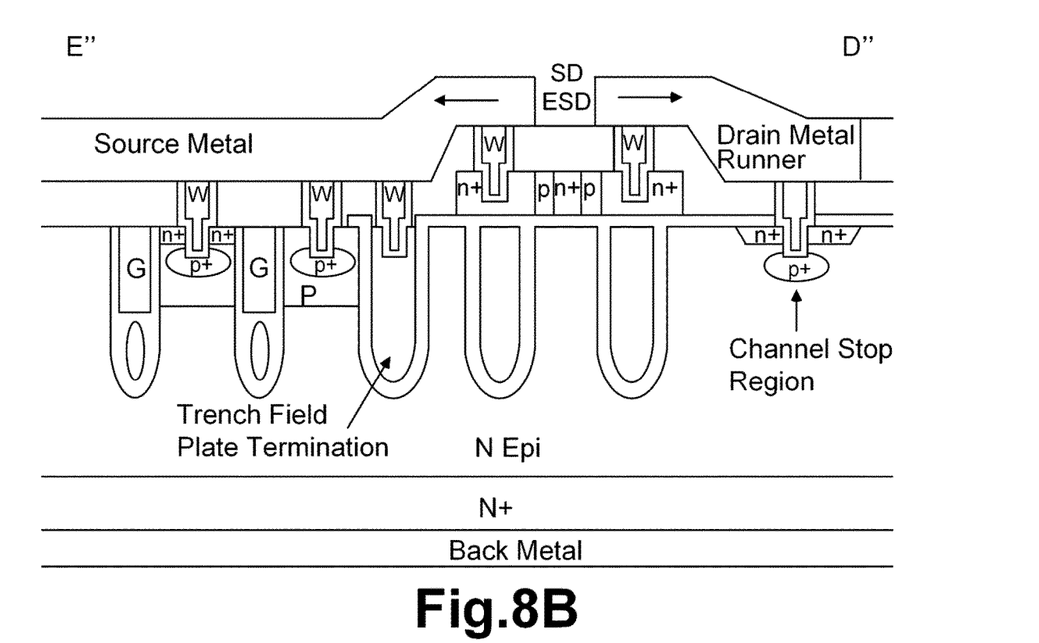
FIG. 8B is a side cross-sectional view of a trench MOSFET along D"-E" axis marked in FIG. 7 of a preferred embodiment according to the present invention.

Please refer to FIG. 8A and FIG. 8B for a preferred embodiment of this invention showing the A"-B"-C" and D"-E" cross section of FIG. 6, respectively. The trench MOSFET structure disclosed in FIG. 8B is similar to that in FIG. 4B except that in FIG. 8B is the device with SD Poly Zener Clamp Diodes for SD protection of this invention while that in FIG. 4B is the device with GD Poly Zener Clamp Diodes for GD protection.

Figure 9A:
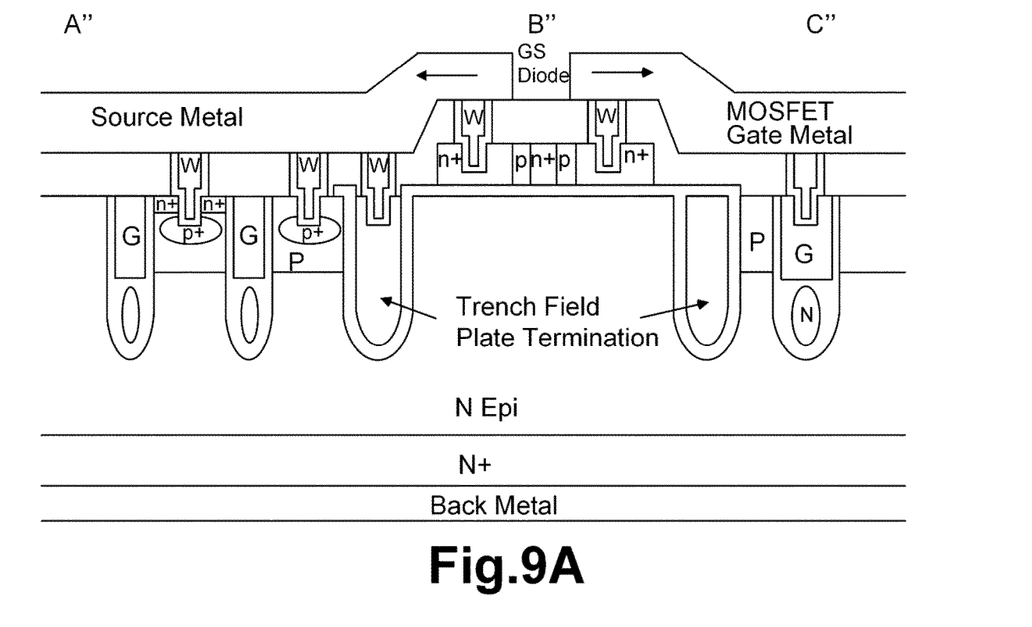
FIG. 9A is a side cross-sectional view of a trench MOSFET along A"-B"-C" axis marked in FIG. 7 of another preferred embodiment according to the present invention.
Figure 9B:
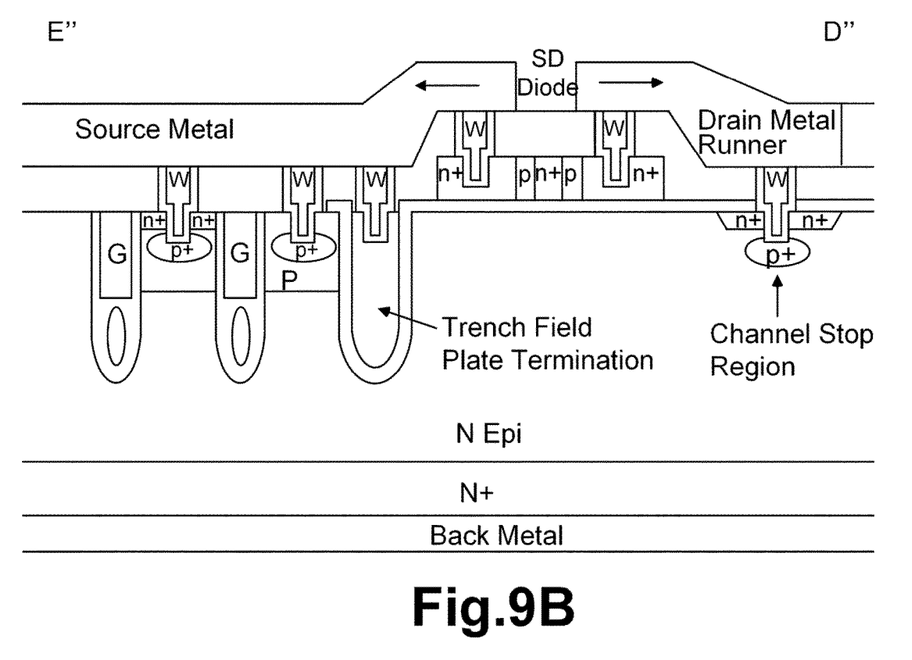
FIG. 9B is a side cross-sectional view of a trench MOSFET along D"-E" axis marked in FIG. 7 of another preferred embodiment according to the present invention.

Please refer to FIG. 9A and FIG. 9B for another preferred embodiment of this invention showing the A"-B"-C" and D"-E" cross section of FIG. 6, respectively. The trench MOSFET structure disclosed is similar to the structure in FIG. 8A and FIG. 8B except that no third type trenches filled with the shielded gate exist in the structure shown in FIG. 9A and FIG. 9B.

Figure 10A:
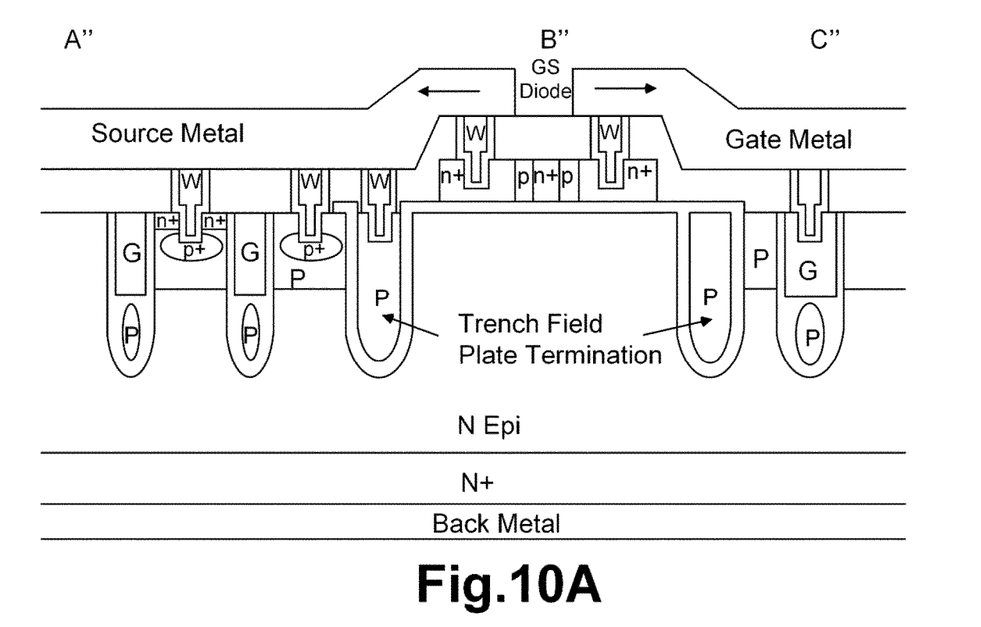
FIG. 10A is a side cross-sectional view of a trench MOSFET along A"-B"-C" axis marked in FIG. 7 of another preferred embodiment according to the present invention.
Figure 10B:
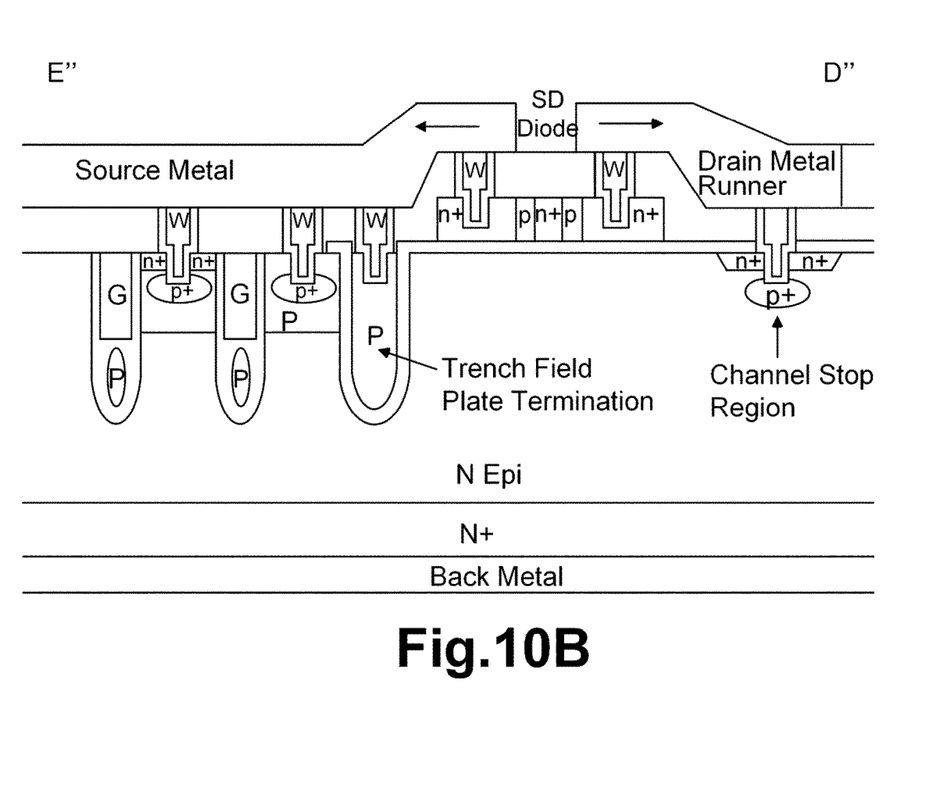
FIG. 10B is a side cross-sectional view of a trench MOSFET along D"-E" axis marked in FIG. 7 of another preferred embodiment according to the present invention.

Please refer to FIG. 10A and FIG. 10B for another preferred embodiment of this invention showing the A"-B"-C" and D"-E" cross section of FIG. 6, respectively. The trench MOSFET structure disclosed is similar to the structure in FIG. 9A and FIG. 9B except that shielded electrode is doped with a second conductivity type (P) which is opposite to the first conductivity type (N).

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising:
   an epitaxial layer of a first conductivity type extending over a substrate;
   a plurality of first type trenches formed in said epitaxial layer in an active area, each of said first type trenches being filled with a first type shielded gate structure comprising a first poly-silicon in a lower portion to serve as a first shielded electrode and a second poly-silicon layer in an upper portion to serve as a gate electrode, wherein said first shielded electrode is insulated from said epitaxial layer by a first insulating film and said gate electrode is insulated from said epitaxial layer by a gate insulating film which has a thickness less than said first insulating film, wherein said first shielded electrode and said gate electrode are insulated from each other by a second insulating film; and
   a trench field plate termination area comprises at least a second type trench surrounding said active area, wherein each of said second type trench is filled with a second shielded electrode and connected with a source metal;
   a Gate-Drain(GD) clamp diode formed between a gate metal and a drain metal along a device periphery; and
   a Gate-Source(GS) clamp diode formed between said gate metal and said source metal.

2. The semiconductor power device of claim 1, wherein: said first and second shielded electrodes and said gate electrode are doped with said first conductivity type.

3. The semiconductor power device of claim 1, further comprises a third type trenches filled with a third shielded electrode disposed directly and symmetrically underneath trenched contact areas of anode and cathode in said GD and GS clamp diodes, serving as a buffer layer for prevention of gate-drain shortage.

4. The semiconductor power device of claim 1, wherein: said GD and GS clamp diodes are constituted of at least one pair of back to back Zener diodes comprising multiple alternatively arranged doped regions of said first conductivity type and doped regions of a second conductivity type opposite to said first conductivity type.

* * * * *